(12) United States Patent
Hashimoto et al.

(10) Patent No.: US 10,672,958 B2
(45) Date of Patent: Jun. 2, 2020

(54) LIGHT EMITTING DEVICE AND MANUFACTURING METHOD THEREOF

(71) Applicant: NICHIA CORPORATION, Anan-shi (JP)

(72) Inventors: Toru Hashimoto, Tokushima (JP); Yukihiro Shibano, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/215,644

(22) Filed: Dec. 11, 2018

(65) Prior Publication Data

US 2019/0123245 A1    Apr. 25, 2019

Related U.S. Application Data

(60) Division of application No. 15/697,452, filed on Sep. 7, 2017, now Pat. No. 10,186,641, which is a
(Continued)

(30) Foreign Application Priority Data

Jul. 14, 2015  (JP) .................................. 2015-140405

(51) Int. Cl.
*H01L 33/54* (2010.01)
*H01L 33/48* (2010.01)
(Continued)

(52) U.S. Cl.
CPC ............ *H01L 33/54* (2013.01); *H01L 33/486* (2013.01); *H01L 33/502* (2013.01); *H01L 33/56* (2013.01);
(Continued)

(58) Field of Classification Search
CPC ..... H01L 33/486; H01L 33/502; H01L 33/56; H01L 2933/0033; H01L 2933/0041; H01L 2933/005
See application file for complete search history.

(56) References Cited

U.S. PATENT DOCUMENTS

| 6,608,334 B1 | 8/2003 | Ishinaga |
| 2001/0002049 A1 | 5/2001 | Reeh et al. |

(Continued)

FOREIGN PATENT DOCUMENTS

| JP | 2001-168400 | 6/2001 |
| JP | 2009-147030 | 7/2009 |

(Continued)

OTHER PUBLICATIONS

Office Action with Form PTO-892 Notice of References Cited issued by the U.S. Patent and Trademark Office for U.S. Appl. No. 15/209,761, dated Jan. 27, 2017.
(Continued)

*Primary Examiner* — Feifei Yeung Lopez
(74) *Attorney, Agent, or Firm* — Mori & Ward, LLP

(57) ABSTRACT

A method for manufacturing a light emitting device includes providing a frame having a through hole extending from a frame upper surface to a frame lower surface in a height direction. The frame has a communication path extending from a frame outer lateral surface to a frame inner lateral surface on the frame lower surface. A support body is provided on the frame lower surface. A light emitting element is provided on a support body upper surface in the through hole. Resin is injected into the through hole via the communication path to provide a covering member in the through hole such that at least a part of an element upper surface of the light emitting element is exposed from the covering member. A light-transmissive member is provided
(Continued)

on the element upper surface and the covering member. The support body is removed.

16 Claims, 11 Drawing Sheets

Related U.S. Application Data continuation of application No. 15/209,761, filed on Jul. 14, 2016, now Pat. No. 9,786,821.

(51) Int. Cl.
*H01L 33/56* (2010.01)
*H01L 33/50* (2010.01)
*H01L 33/62* (2010.01)

(52) U.S. Cl.
CPC ........ *H01L 33/62* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

| | | |
|---|---|---|
| 2007/0187705 A1 | 8/2007 | Tanaka et al. |
| 2010/0320482 A1* | 12/2010 | Tachibana ............. H05K 3/284 257/88 |
| 2011/0309388 A1 | 12/2011 | Ito et al. |
| 2012/0302124 A1* | 11/2012 | Imazu .................. H01L 33/486 445/58 |
| 2013/0037842 A1* | 2/2013 | Yamada .................. H01L 33/60 357/98 |
| 2013/0207145 A1 | 8/2013 | Schneider et al. |
| 2013/0277681 A1 | 10/2013 | Wada et al. |
| 2014/0138725 A1 | 5/2014 | Oyamada |
| 2016/0013373 A1 | 1/2016 | Bhat et al. |

FOREIGN PATENT DOCUMENTS

| | | |
|---|---|---|
| JP | 2010-219324 | 9/2010 |
| JP | 2011-003706 | 1/2011 |
| JP | 2011-129793 | 6/2011 |
| JP | 2012-227470 | 11/2012 |
| JP | 2013-012545 | 1/2013 |
| JP | 2013-534733 | 9/2013 |
| JP | 2014-112669 | 6/2014 |

OTHER PUBLICATIONS

Notice of Allowance issued by the United States Patent and Trademark Office for the U.S. Appl. No. 15/209,761, dated Jun. 15, 2017.
Office Action with Form PTO-892 Notice of References Cited issued by the U.S. Patemt and Trademark Office for the U.S. Appl. No. 15/697,452, dated Mar. 29, 2018.
Notice of Allowance issued by the United States Patent and Trademark Office for the parent U.S. Appl. No. 15/697,452, dated Sep. 12, 2018.

* cited by examiner

LIGHT EMITTING DEVICE AND MANUFACTURING METHOD THEREOF

CROSS-REFERENCE TO RELATED APPLICATIONS

The present application is a divisional application of the U.S. patent application Ser. No. 15/697,452 filed on Sep. 7, 2017, which is a continuation application of the U.S. patent application Ser. No. 15/209,761 filed on Jul. 14, 2016, which was issued as the U.S. Pat. No. 9,786,821, which claims priority under 35 U.S.C. § 119 to Japanese Patent Application No. 2015-140405, filed on Jul. 14, 2015. The contents of these applications are incorporated herein by referenced in their entirety.

BACKGROUND OF THE INVENTION

Technical Field

The present invention relates to a light emitting device and a manufacturing method of a light emitting device.

Discussion of the Background

For example, Japanese Unexamined Patent Application Publication No. 2010-219324, Japanese Unexamined Patent Application Publication No. 2012-227470, Japanese Unexamined Patent Application Publication No. 2013-012545, and Japanese Unexamined Patent Application Publication No. 2014-112669 describe light emitting devices in which a lateral surface of a light emitting element is covered with a reflective member without providing a housing to house the light emitting element.

SUMMARY OF THE INVENTION

According to one aspect of the present invention, a method for manufacturing a light emitting device includes providing a frame having a frame upper surface and a frame lower surface opposite to the frame upper surface in a height direction. The frame has an opening extending from the frame upper surface to the frame lower surface in the height direction. The frame has a frame inner lateral surface defining the opening and a frame outer lateral surface connecting the frame upper surface and the frame lower surface to surround the opening when viewed in the height direction. The frame has a communication path extending from the frame outer lateral surface to the frame inner lateral surface on the frame lower surface. A support body is provided on the frame lower surface. The support body has a support body upper surface that faces the frame lower surface. A light emitting element is provided on the support body upper surface in the opening of the frame. The light emitting element has an element lower surface facing the support body upper surface and an element upper surface opposite to the element lower surface in the height direction. A light is configured to be emitted from the element upper surface. Resin is injected into the opening of the frame via the communication path to provide a covering member in the opening such that at least a part of the element upper surface of the light emitting element is exposed from the covering member. A light-transmissive member is provided on the element upper surface and the covering member. The support body is removed.

According to another aspect of the present invention, a light emitting device includes a light emitting element, a first covering member, and a second covering member. The light emitting element includes a layered structure including a light emitting layer, an electrode provided on the layered structure in a height direction and having an inner surface contacting the layered structure, an outer surface opposite to the inner surface in the height direction, and a lateral surface connecting the inner surface and the outer surface. The first covering member covers the lateral surface of the electrode. The second covering member covers the first covering member. A first part of the first covering member is exposed from the second covering member as viewed in the height direction. A second part of the first covering member is exposed from the second covering member as viewed in a lateral direction perpendicular to the height direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1A:
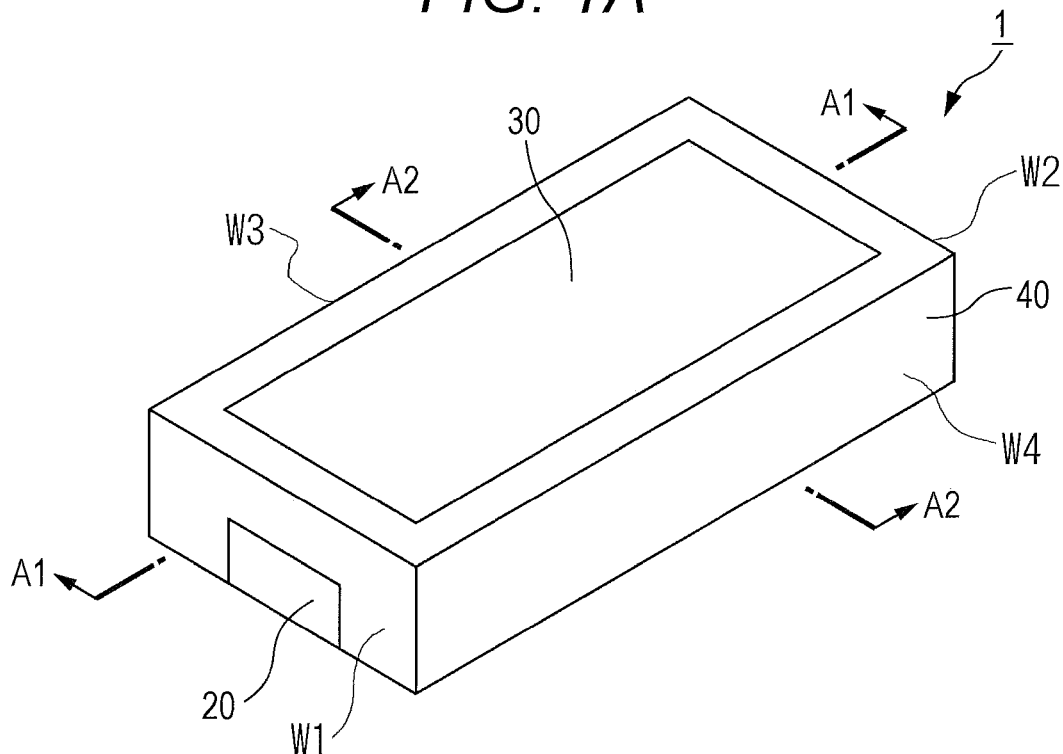
FIG. 1A is a schematic perspective view of a light emitting device in a first embodiment taken from an upper diagonal direction.

The embodiments will now be described with reference to the accompanying drawings, wherein like reference numerals designate corresponding or identical elements throughout the various drawings.

Hereinafter, embodiments of the present invention will be described in detail with reference to the drawings. In addition, the following description occasionally uses terms expressing specific directions and positions (such as "upper", "lower", "right", "left", and other terms including those terms). Since the terms are used to easily understand the embodiments of the present invention with reference to the drawings, the technical scope of the present invention is not limited by the meanings of those terms. Furthermore, the same part or the same member is marked with the same reference sign in the drawings.

Furthermore, a "frame" may be also referred to as a "side wall" provided to surround one opening. When the one frame is provided with a plurality of openings, the side wall is provided with respect to each opening. That is, the frame or side wall includes not only an outermost side wall, but also a partition wall between the openings when viewed as a whole. Furthermore, as for the one frame (i.e., side wall) surrounding the one opening, a lateral surface on a side on which a light emitting element is mounted is referred to as an inner surface, and a lateral surface opposite to the inner surface is referred to as an outer surface. In addition, in a case where the two openings on which the light emitting elements are mounted share the one frame as their side walls, the inner surface of the one opening serves as the outer surface of the other opening, that is, the one lateral surface serves as both of the inner surface and the outer surface. In this case, the inner surface and the outer surface are specified with respect to either one of the openings, for convenience of the description.

First Embodiment

Figure 1B:
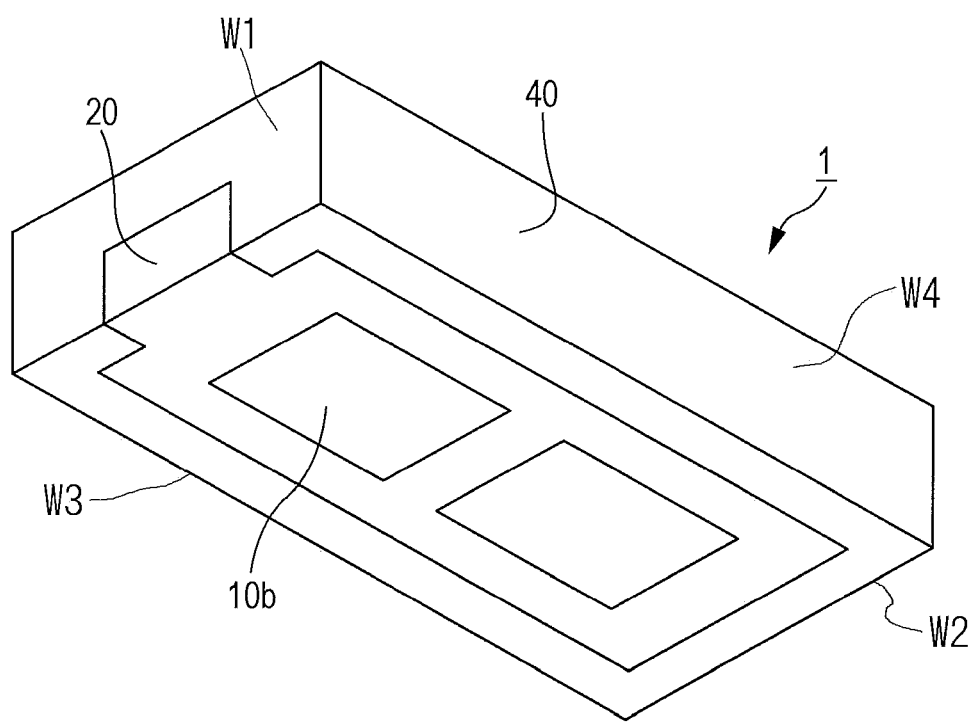
FIG. 1B is a schematic perspective view of the light emitting device in the first embodiment taken from a lower diagonal direction.
Figure 1C:
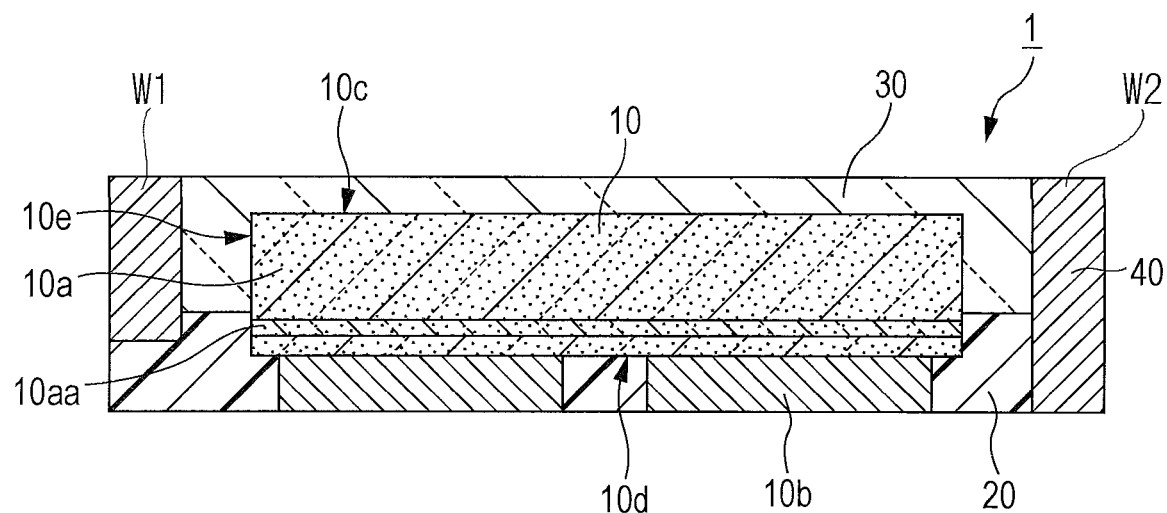
FIG. 1C is a schematic cross-sectional view taken along a line A1-A1 in FIG. 1A.
Figure 1D:
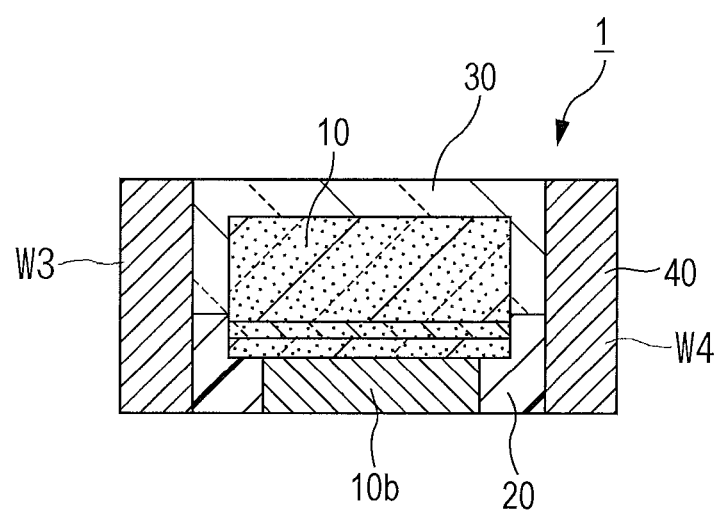
FIG. 1D is a schematic cross-sectional view taken along a line A2-A2 in FIG. 1A.
Figure 2A:
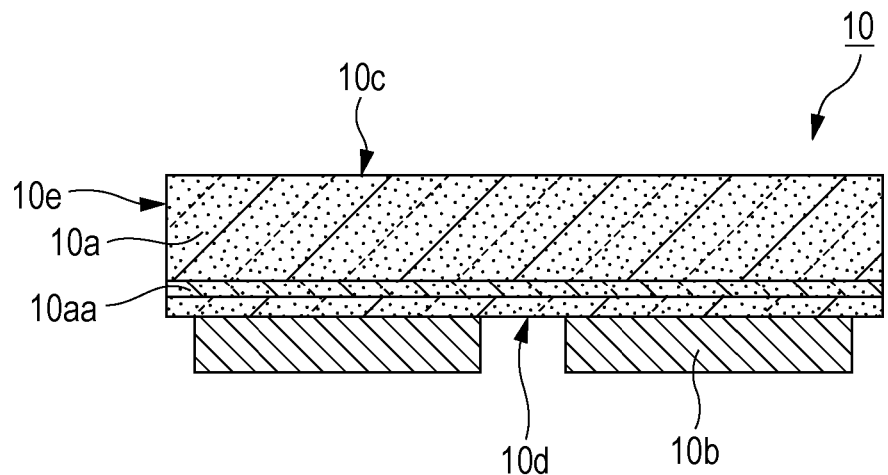
FIG. 2A is a schematic cross-sectional view of a light emitting element used in the light emitting device in some embodiments disclosed herein.
Figure 2B:
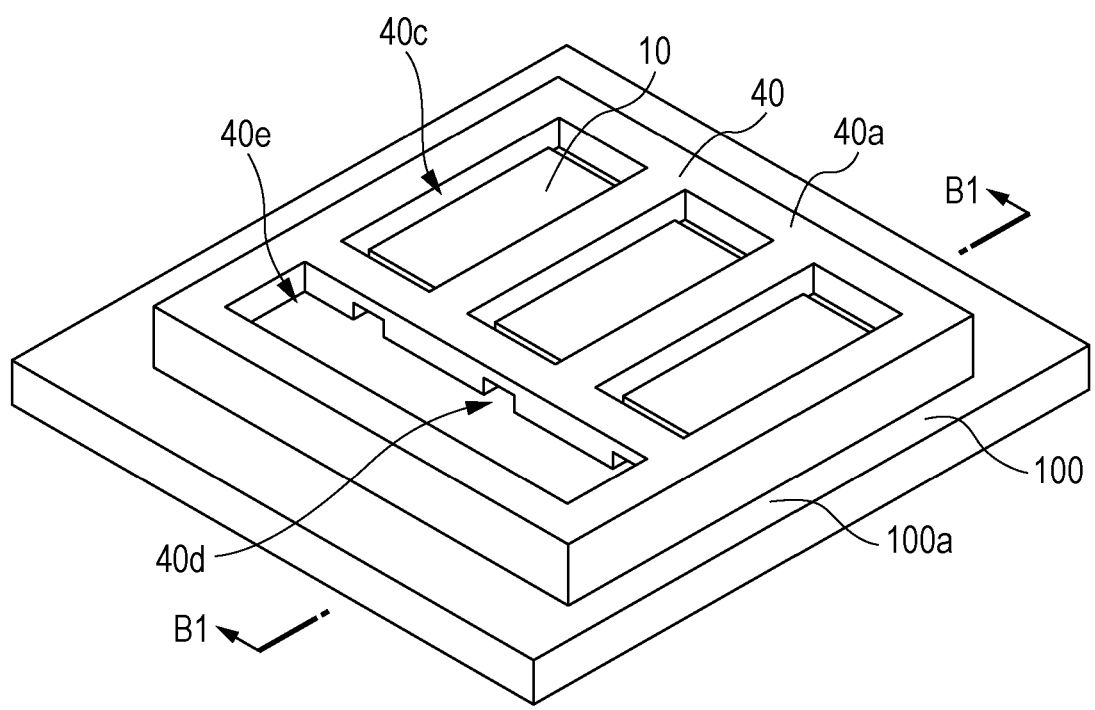
FIG. 2B is a schematic view showing a method for manufacturing the light emitting device in the first embodiment.
Figure 2C:
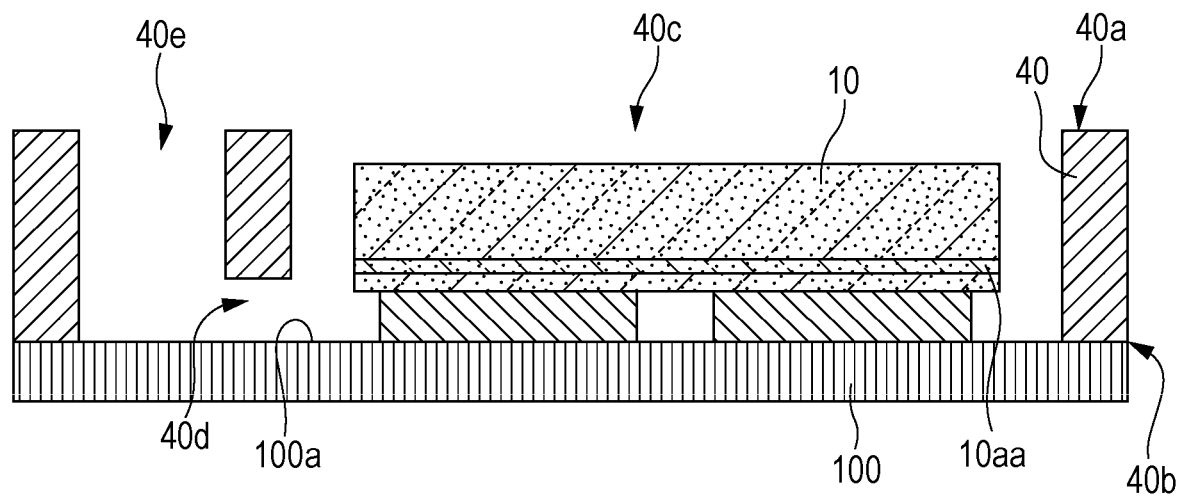
FIG. 2C is a schematic view showing the method for manufacturing the light emitting device in the first embodiment.
Figure 2D:
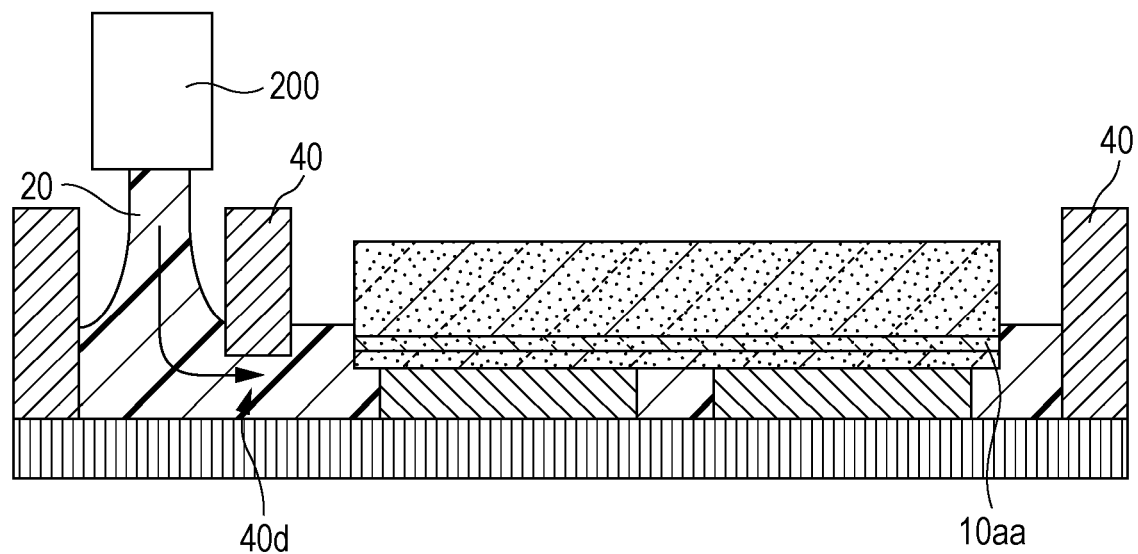
FIG. 2D is a schematic view showing the method for manufacturing the light emitting device in the first embodiment.
Figure 2E:
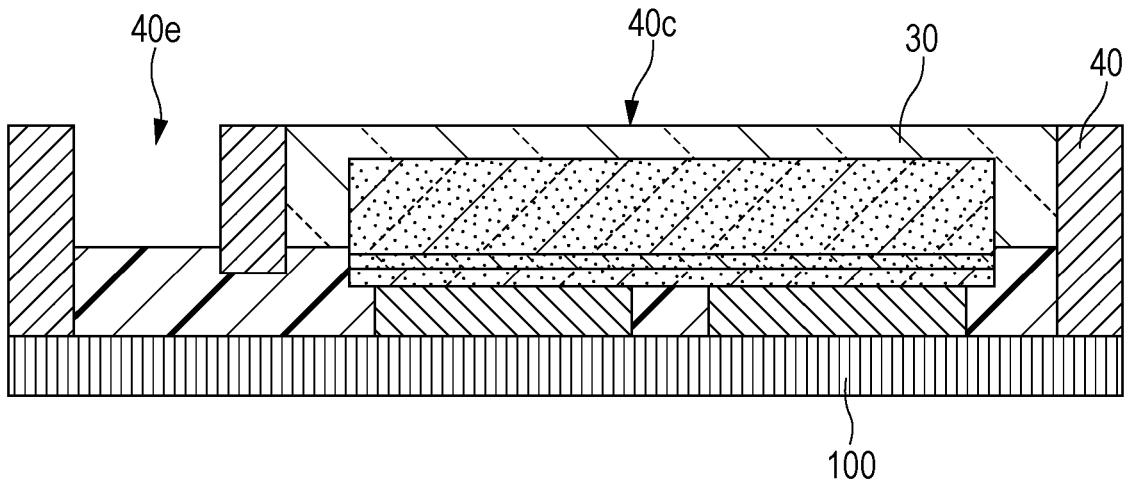
FIG. 2E is a schematic view showing the method for manufacturing the light emitting device in the first embodiment.
Figure 2F:
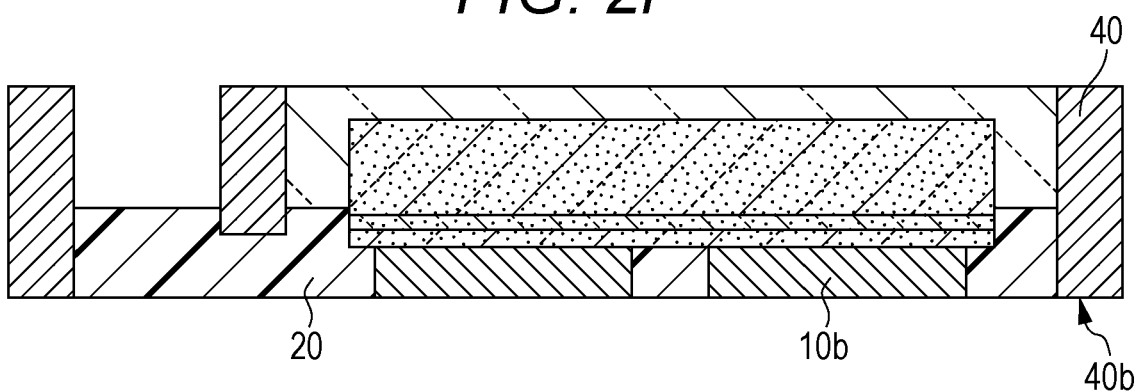
FIG. 2F is a schematic view showing the method for manufacturing the light emitting device in the first embodiment.
Figure 2G:
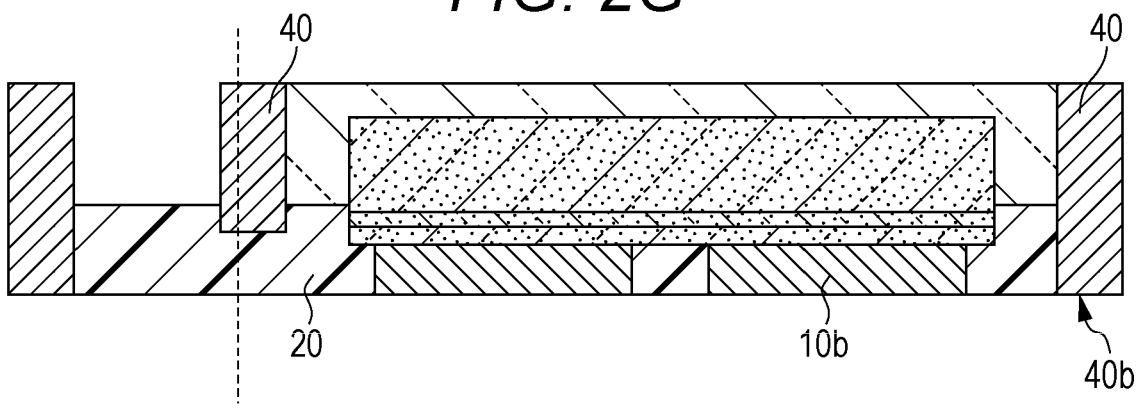
FIG. 2G is a schematic view showing the method for manufacturing the light emitting device in the first embodiment.

FIGS. 1A to 1D illustrate a light emitting device 1 in the first embodiment. FIG. 1A is a schematic perspective view of the light emitting device 1 taken from an upper diagonal direction, FIG. 1B is a schematic perspective view of the light emitting device 1 taken from a lower diagonal direction, FIG. 1C is a schematic cross-sectional view taken along a line A1-A1 in FIG. 1A, and FIG. 1D is a schematic cross-sectional view taken along a line A2-A2 in FIG. 1A.

The light emitting device 1 includes a light emitting element 10, a covering member 20 to cover a lateral surface 10e of the light emitting element, a light-transmissive member 30 to cover an upper surface 10c of the light emitting element and an upper surface of the covering member 20, and a frame (a second covering member) 40 surrounding a lateral surface of the light-transmissive member 30 and a lateral surface of the covering member 20. The frame 40 has a first wall W1, a second wall W2, a third wall W3, and a fourth wall W4. A method for manufacturing the light emitting device in the first embodiment will be described with reference to FIGS. 2A to 2G.

Step of Preparing Light Emitting Element

The light emitting element is provided by preparing a semiconductor light emitting element such as light emitting diode. The light emitting element 10 includes a layered structure 10a composed of a light-transmissive substrate and semiconductor layers, and an electrode 10b. The layered structure 10a includes a light emitting layer 10aa in the semiconductor layers. The upper surface 10c serves as a light extracting surface which is opposite to a lower surface (i.e., electrode forming surface 10d) on which the electrode 10b is formed.

Step of Preparing Support Body

A support body 100 having an upper surface 100a is prepared. The support body may be a support body having a bonding member to bond a frame which will be described below, or may be a support body not having the bonding member.

Step of Preparing Frame

A frame 40 is prepared which has an upper surface 40a and a lower surface 40b, and includes an opening 40c penetrating from the upper surface to the lower surface. A height of the frame 40 (i.e., length between the upper surface to the lower surface) is higher than a height of the light emitting element to be provided in a subsequent step. The frame 40 includes a through hole 40d which penetrates from an outer surface to an inner surface in the frame (i.e., side wall) surrounding the one opening. This through hole 40d serves as an inlet (a communication path) 40d through which a resin is injected into the opening. An upper end of the inlet 40d is spaced apart from the upper surface 40a of the frame. A lower end of the inlet 40d is at the same level as the lower surface of the frame (i.e., the lower surface bonded to the support body). That is, the through hole 40d may be referred to as a notch in the lower surface of the frame, or a recessed portion of the lower surface.

Step of Mounting Frame on Support Body

The frame is mounted on the upper surface 100a of the support body with the lower surface 40b facing thereto. It is preferable that a bonding member is provided on the upper surface 100a of the support body and/or the lower surface 40b of the frame, and the support body and the frame are bonded through the bonding member. Thus, after the support body 100 and the frame 40 have been bonded, a recessed portion is formed in a position corresponding to the opening 40c of the frame. In other words, in the recessed portion, the upper surface 100a of the support body serves as its bottom surface, and the frame 40 serves as its side wall.

The through hole 40d of the frame serves as the inlet to be used for injecting the resin as described above, and the inlet partially includes the upper surface 100a of the support body.

Step of Mounting Light Emitting Element

The light emitting element 10 is mounted on the upper surface 100a of the support body in the opening 40c of the frame. A die bond member is provided on the upper surface 100a of the support body and/or the lower surface of the light emitting element 10 (or a lower surface of the electrode 10b when the lower surface has the electrode), and the support body 100 and the light emitting element 10 are bonded through the die bond member. Regarding a mounting order of the frame 40 and the light emitting element 10 on the upper surface 100a of the support body, the light emitting element 10 may be mounted after the frame 40 has been mounted, or the frame 40 may be mounted after the light emitting element 10 has been mounted. Preferably, the frame 40 is first mounted on the upper surface 100a of the support body. Furthermore, the light emitting element is preferably mounted so that the lateral surface 10e is spaced apart from the inner lateral surface of the frame 40. It is especially preferable that the light emitting element is mounted so that each surface is equally spaced apart from the inner lateral surface of the frame 40. In other words, the light emitting element 10 is preferably mounted so that its center approximately coincides with a center of the opening 40c of the frame.

Step of Forming Covering Member

Subsequently, the covering member 20 is formed by injecting the resin from the outer side of the opening 40c to the inner side of the opening 40c through the inlet 40d provided in the frame (i.e., side wall) 40. In other words, the covering member 20 is formed by filling a space between the lateral surface 10e of the light emitting element and the frame 40 (i.e., the inner surface) with the resin. When there is a gap between the light emitting element 10 and the upper surface 100a of the support body, the covering member 20 is formed by filling the gap with the resin.

The covering member 20 is to be provided so as not to cover at least one part of the upper surface 10c of the light emitting element mounted in the opening 40c. Preferably, it is to be provided so that the upper surface 10c of the light emitting element is wholly exposed. Furthermore, the covering member 20 may wholly cover the lateral surface 10e of the light emitting element, or may be provided so as to cover up to at least the light emitting layer 10aa, or to cover up to the lateral surface lower than the light emitting layer. Furthermore, the covering member 20 may only cover the lower surface of the light emitting element. Preferably, it is to be provided so as to wholly cover the lateral surface 10e of the light emitting element. The upper surface of the covering member 20 provided between the inner surface of the frame 40 and the lateral surface 10e of the light emitting element may be a flat surface, or a curved surface. In the latter case, the upper surface may be inclined so as to be low at the lateral surface 10e side of the light emitting element and high at the inner surface side of the frame 40. For example, an inclined angle of the upper surface of the covering member 20 is preferably in a range of about 20 degrees to about 80 degrees, and more preferably in a range of about 40 degrees to about 50 degrees with respect to the upper surface of the support body.

The covering member 20 is formed of the resin injected through the inlet 40d provided in the frame. That is, the covering member 20 is formed of the resin which is injected not from the above, but from the side, in the opening 40c of the frame in which the light emitting element is mounted. That is, since the resin is injected from the position lower than the upper surface (i.e., light extracting surface) 10c of the light emitting element, the upper surface of the light emitting element may not likely to be covered with the resin.

The openings provided in the frame 40 may include the element mounting opening 40c in which the light emitting element is mounted, and a resin supplying opening 40e provided adjacently. The inlet for the resin is provided so as to penetrate the frame (side wall) 40 provided between the element mounting opening 40c and the resin supplying opening 40e. Thus, the resin is supplied from an upper part of the resin supplying opening 40e to the resin supplying opening 40e with a nozzle for example, and the resin is injected into the element mounting opening 40c through the inlet 40d provided in the frame. The resin is in a flowable liquid state at the time of injection, and its liquid surface (i.e., upper surface of the resin) is at almost the same level in both openings provided across the through hole (i.e., inlet). Therefore, an amount of the resin injected into the element mounting opening can be easily seen from the opening. Thus, an appropriate amount of resin can be filled, so that the resin can be prevented from being excessively supplied, and the upper surface of the light emitting element can be exposed. Furthermore, the resin is filled in the element mounting opening upward from the bottom surface, so that a void (cavity) can be prevented from being formed under the light emitting element and in a lower portion (i.e., corner portion) of the frame.

Step of Forming Light-Transmissive Member

Next, a light-transmissive member 30 is provided on the light emitting element 10 and the covering member 20. The light-transmissive member 30 may be formed by for example potting from an upper part of the opening of the frame 40. In addition, in the case where the frame includes the resin supplying opening for supplying the covering member, the light-transmissive member is not necessarily provided in the resin supplying opening. The light-transmissive member may be composed of one or more layers.

Step of Removing Support Body and Cutting Frame

Subsequently, the support body 100 is removed. After that, the frame 40 is cut (along a broken line in FIG. 2G, for example), whereby the light emitting device 1 illustrated in FIG. 1A can be obtained. The frame may be cut with a dicer, blade, or laser.

As illustrated in FIGS. 1A to 1D, for example, the light-transmissive member and the frame (upper surface thereof) surrounding it compose the upper surface of the light emitting device 1 provided as described above. Thus, when the light emitting surface is surrounded by the frame which has been previously formed, the light emitting device can be small in size and good in distinguishability.

In addition, the frame 40 and the covering member 20 compose the lateral surface of the light emitting device 1 provided as described above. The even lateral surface is composed of the frame 40 and the covering member 20. Furthermore, the covering member 20 continuously forms the outer surface from the lateral surface to the lower surface of the light emitting device 1. The electrode 10b of the light emitting element is exposed in the lower surface of the light emitting device 1 and surrounded by the covering member 20. Furthermore, the frame surrounds the lateral sides of the covering member 20.

Second Embodiment

Figure 3A:
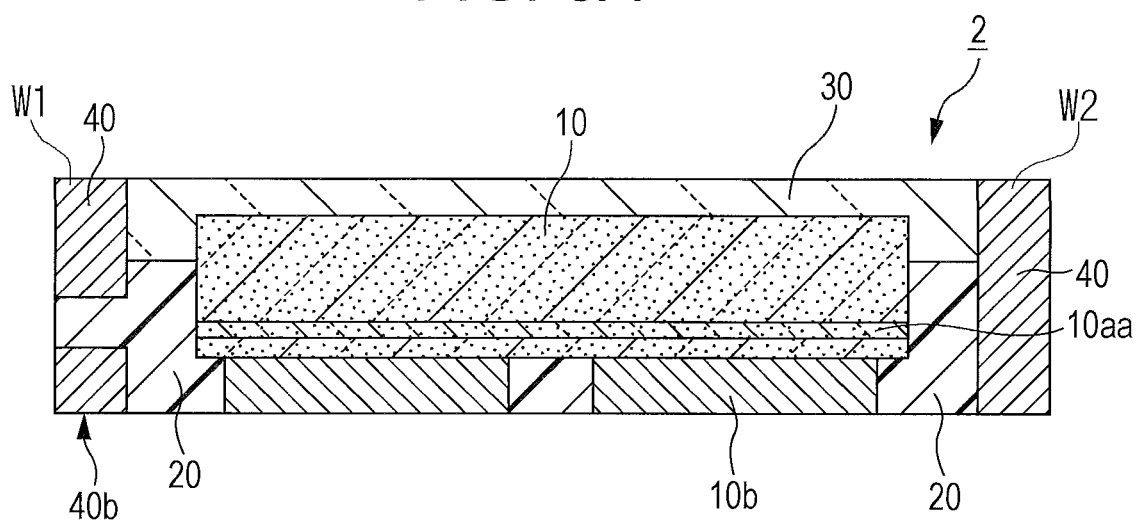
FIG. 3A is a schematic cross-sectional view of a light emitting device in a second embodiment.
Figure 3B:
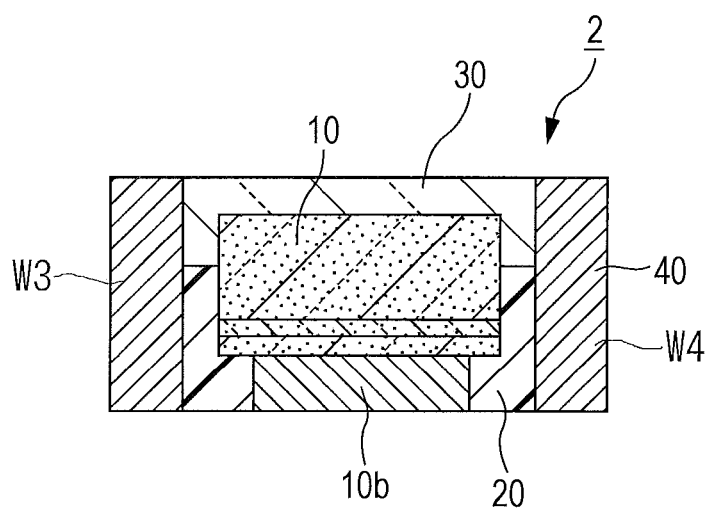
FIG. 3B is a schematic cross-sectional view of the light emitting device in the second embodiment.

FIGS. 3A and 3B illustrate a light emitting device 2 in the second embodiment. The light emitting device 2 includes a light emitting element 10, a covering member 20 to cover a lateral surface 10e of the light emitting element, a light-transmissive member 30 to cover an upper surface 10c of the light emitting element and an upper surface of the covering member 20, and a frame 40 surrounding a lateral surface of the light-transmissive member 30 and a lateral surface of the covering member 20. The second embodiment is similar to the first embodiment except that a through hole (inlet) in the frame is formed in a position spaced apart from a lower surface of the frame. Therefore, a different point will be described.

Figure 4:
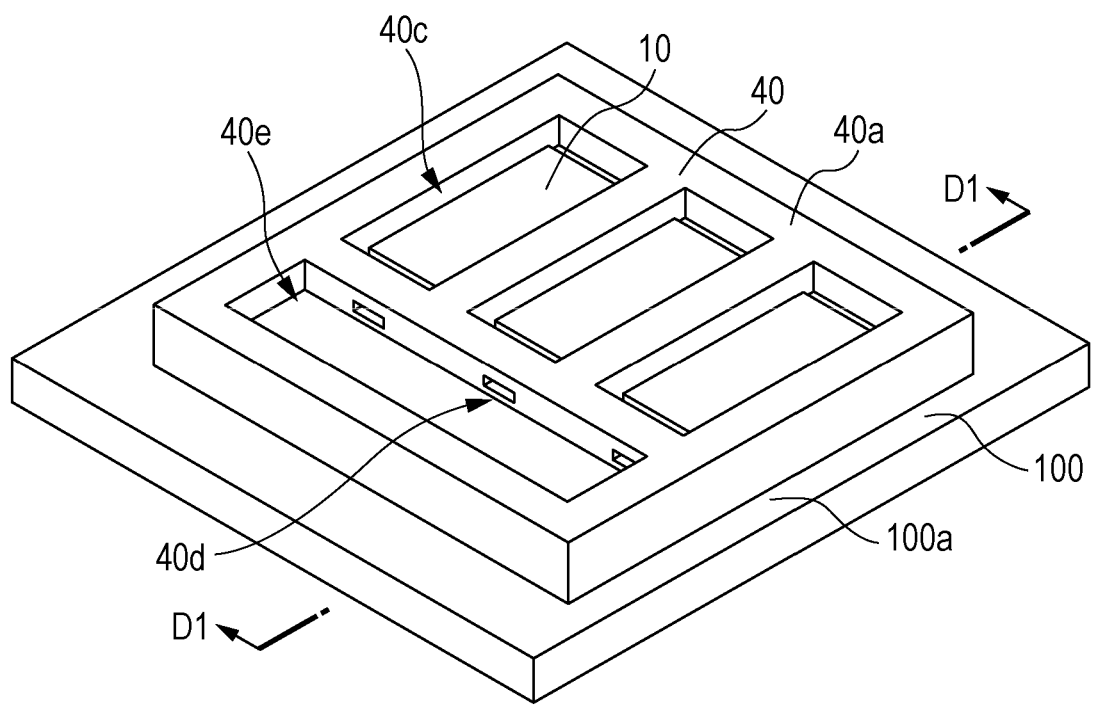
FIG. 4 is a schematic view showing a method for manufacturing the light emitting device in the second embodiment.

As illustrated in FIG. 4, the frame 40 includes the through hole (inlet) penetrating from an outer surface to an inner surface. An upper end of the inlet is away from an upper surface of the frame, and a lower end of the inlet is away from the lower surface of the frame. When the light emitting device includes the frame having the inlet in that position, the covering member composing an outer surface is away from a lower surface of the light emitting device. For example, the lower end of the through hole is preferably lower than a light emitting layer of the light emitting element. In addition, an upper end of the through hole is preferably lower than the upper surface of the light emitting element.

Third Embodiment

Figure 5A:
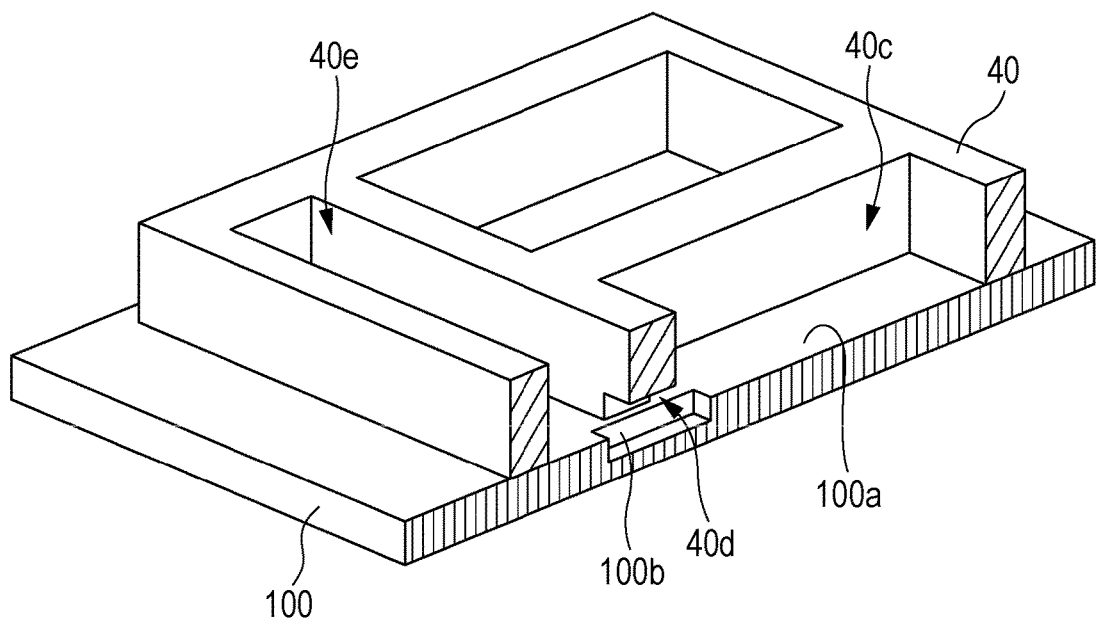
FIG. 5A is a schematic view showing a method for manufacturing a light emitting device in a third embodiment.
Figure 5B:
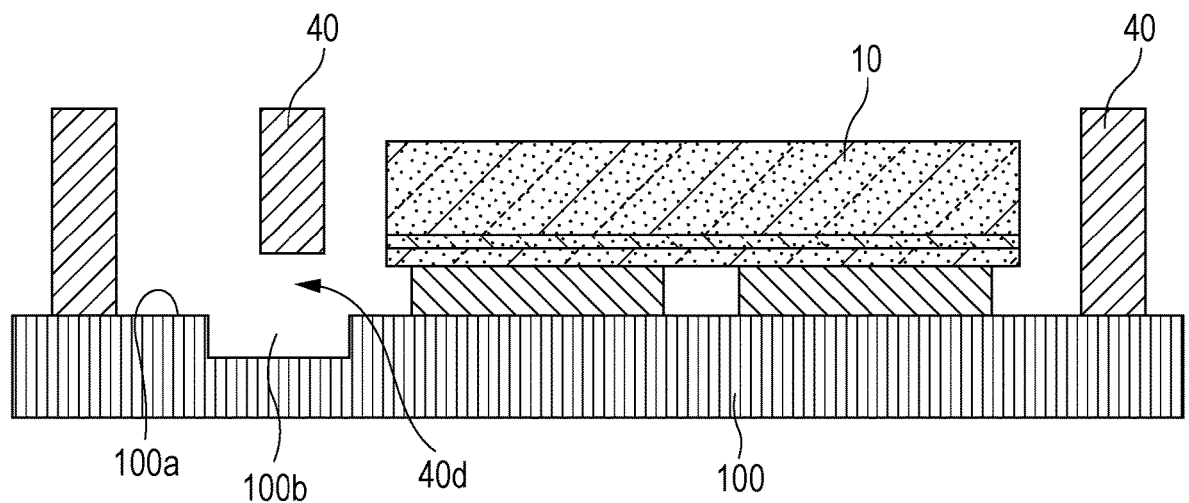
FIG. 5B is a schematic view showing the method for manufacturing the light emitting device in the third embodiment.

A light emitting device in the third embodiment includes a frame 40 and a support body 100 illustrated in FIGS. 5A and 5B. An outline of this light emitting device is similar to that in FIG. 1. The third embodiment is similar to the first embodiment in that a through hole 40d in the frame 40 is a notch to a lower surface of the frame 40 (i.e., a recessed portion of the lower surface of the frame). According to the third embodiment, a groove 100b is provided in an upper surface 100a of the support body 100, and the through hole 40d in the frame and the groove 100b in the support body 100 compose an inlet. The groove 100b is provided in the upper surface of the support body 100, under the through hole 40d of the frame. A width of the through hole 40d of the frame 40, and a width of the groove 100b of the support body 100 may be almost the same or may be different from each other.

Fourth Embodiment

Figure 6A:
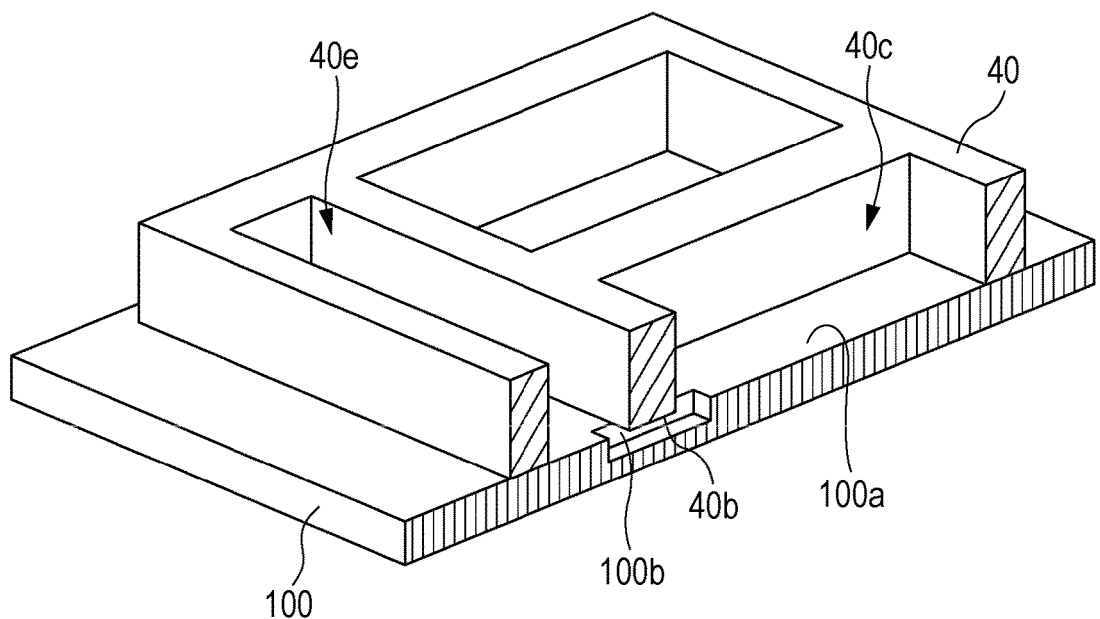
FIG. 6A is a schematic view showing a method for manufacturing a light emitting device in a fourth embodiment.
Figure 6B:
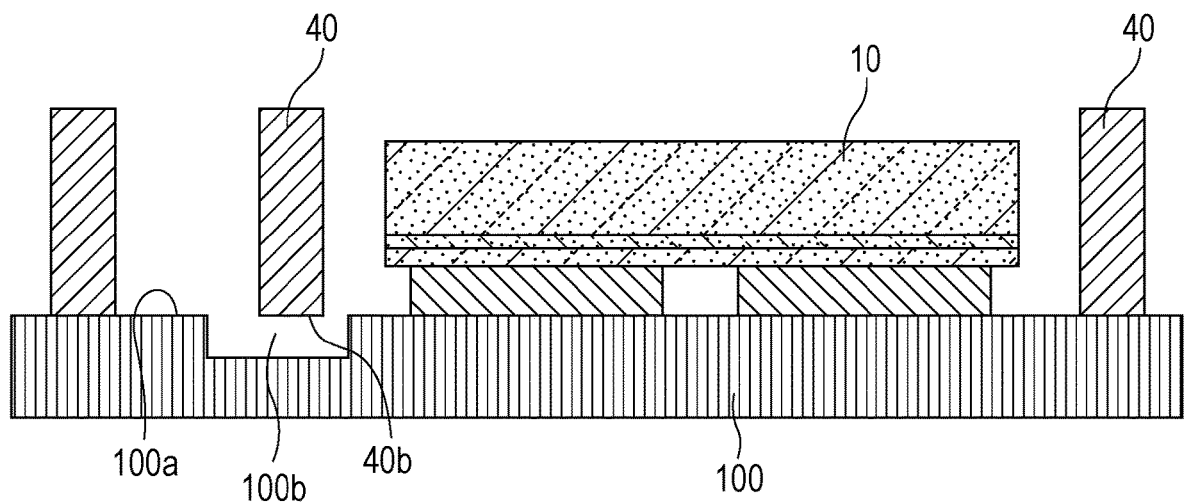
FIG. 6B is a schematic view showing the method for manufacturing the light emitting device in the fourth embodiment.

A light emitting device in the fourth embodiment includes a frame 40 and a support body 100 illustrated in FIGS. 6A and 6B. More specifically, a method for manufacturing the light emitting device includes preparing the frame 40 having an opening 40c penetrating from an upper surface to a lower surface, preparing the support body 100 having a groove 100b which is formed in an upper surface 100a and has a length greater than a distance between an outer surface and an inner surface of the frame, forming an inlet composed of the groove and the lower surface of the frame by disposing the lower surface 40b of the frame above the groove 100b of the support body, mounting a light emitting element on the upper surface of the support body in the opening of the frame, and forming a covering member between the frame and the light emitting element by injecting a resin through the inlet. That is, the frame does not have a through hole, and the frame has an even lower surface. Thus, under the lower surface of the frame, the inlet 40d is composed of the groove 100b in the upper surface of the support body and the lower surface 40b of the frame.

Figure 7A:
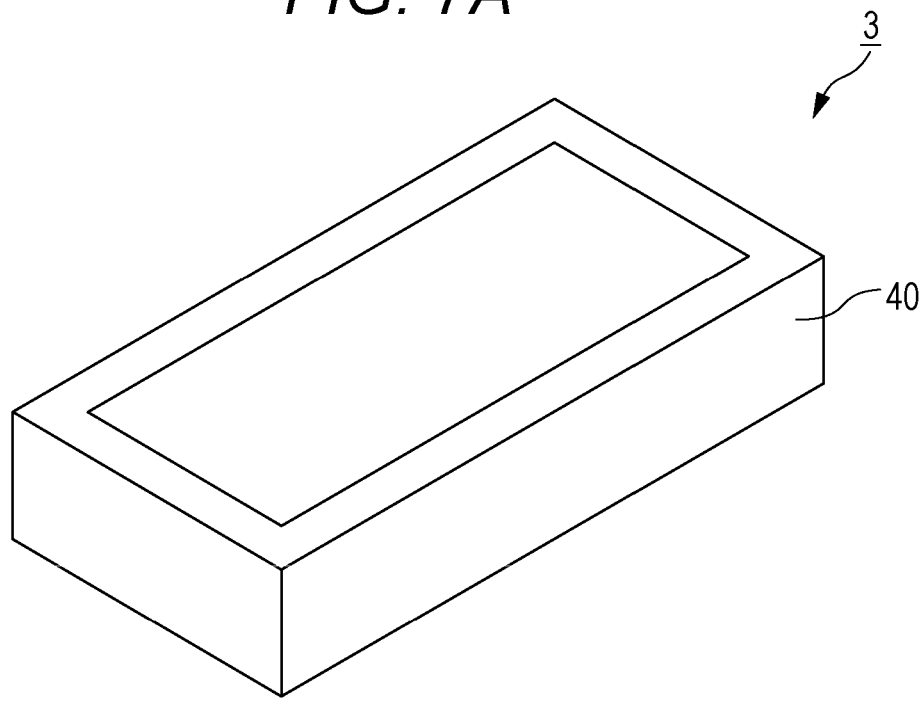
FIG. 7A is a schematic perspective view of the light emitting device in the fourth embodiment taken from an upper diagonal direction.
Figure 7B:
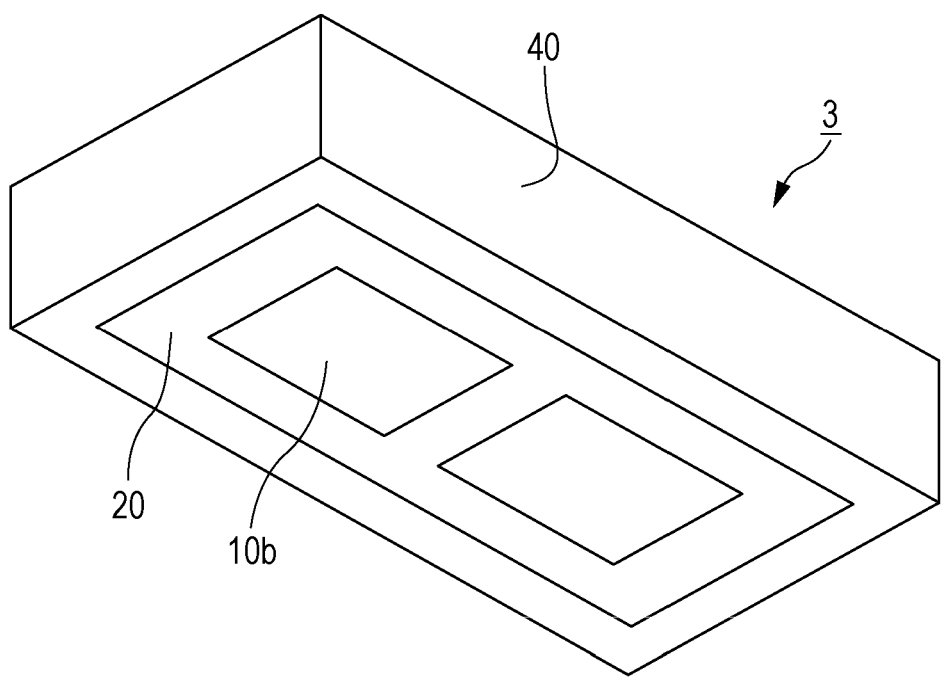
FIG. 7B is a schematic perspective view of the light emitting device in the fourth embodiment taken from a lower diagonal direction.

When a light emitting device 3 includes the above frame and the above support body and manufactured by the steps similar to those in the first embodiment, an outer surface of the light emitting device is only composed of the frame as illustrated in FIGS. 7A and 7B. A covering member is exposed in a lower surface of the light emitting device.

Fifth Embodiment

Figure 8A:
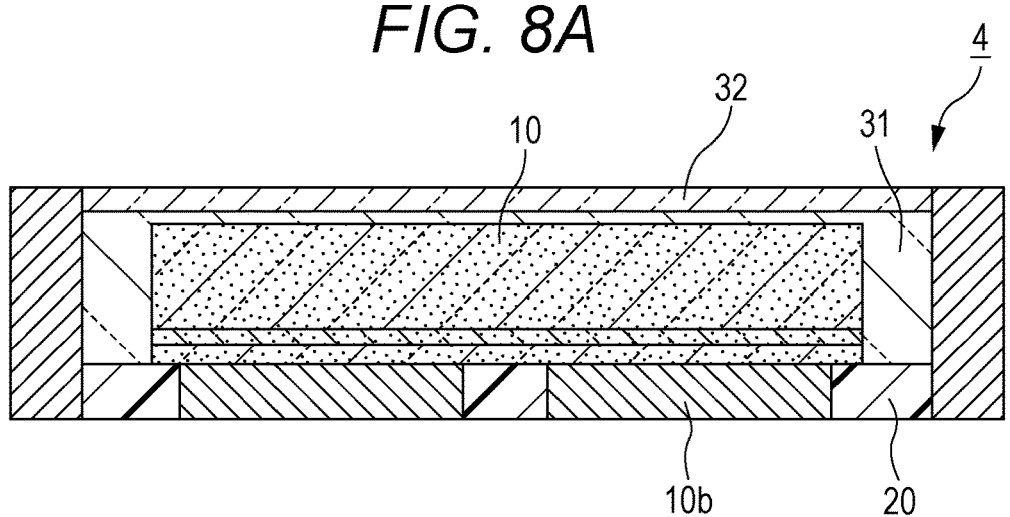
FIG. 8A is a schematic cross-sectional view of a light emitting device in a fifth embodiment.
Figure 8B:
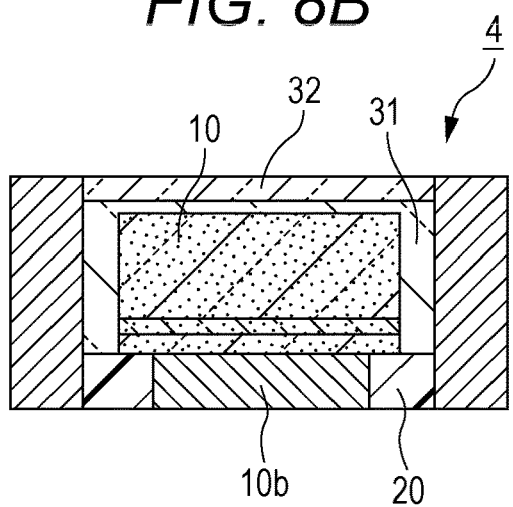
FIG. 8B is a schematic cross-sectional view of the light emitting device in the fifth embodiment.

A light emitting device 4 in the fifth embodiment is composed of the frame and the support body used in the fourth embodiment. According to the fifth embodiment, as illustrated in FIGS. 8A and 8B for example, a covering member 20 does not cover a lateral surface of a light emitting element, or the covering member 20 is provided so as not to cover a light emitting layer. Thus, a light-transmissive member covers an upper surface of the covering member and an upper surface of the light emitting element and is composed of two layers. That is, the light-transmissive members include a first light-transmissive member 31 which covers the lateral surface and the upper surface of the light emitting element 10, and a second light-transmissive member 32 which covers the first light-transmissive member 31. The second light-transmissive member is provided so as not to be in contact with the light emitting element. In the case where the two-layer structure is provided, the first light-transmissive member may be a member (such as a transparent member) not containing a fluorescent material, and the second light-transmissive member may be a layer containing a fluorescent material. In this case, color unevenness can be reduced in a light externally emitted through a fluorescent layer. In addition, the first light-transmissive member 31 may be provided so as to be in contact with the upper surface of the light emitting element.

Figure 9:
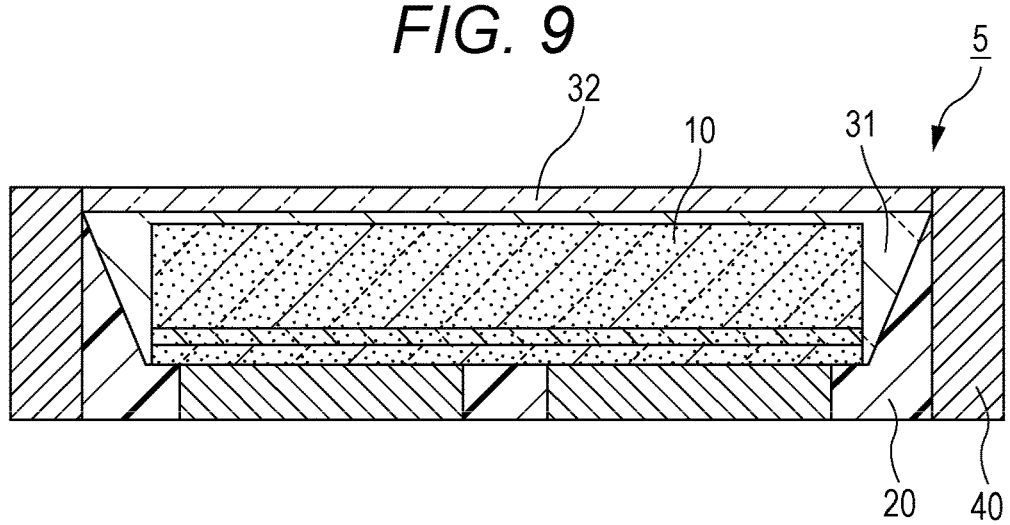
FIG. 9 is a schematic cross-sectional view of the light emitting device in the fifth embodiment.

Furthermore, as illustrated in FIG. 9, a light emitting device 5 may include a covering member 20 having an inclined upper surface. The covering member 20 is preferably formed so as to be high on a side of an inner surface of the frame 40, and low on a lateral surface side of the light emitting element. For example, an inclined angle of the upper surface of the covering member 20 is preferably in a range of about 20 degrees to about 80 degrees with respect to the upper surface of the support body, and more preferably in a range of about 40 degrees to about 50 degrees. Thus, the first light-transmissive member 31 may be provided between the inclined upper surface (i.e., inclined surface) of the covering member 20 and the lateral surface of the light emitting element 10. In this state, the second light-transmissive member 32 may be provided so as to cover the first light-transmissive member 31. When the first light-transmissive member is the member (e.g., transparent member) which does not contain the fluorescent material, the light emitted from the lateral surface of the light emitting element reaches the upper surface (i.e., inclined surface) of the covering member 20. Thus, the light can be efficiently reflected by the covering member 20 in the direction of the upper surface of the light emitting device, so that light extracting efficiency can be improved. In addition, in the case where the upper surface of the covering member 20 is inclined, an adjustment can be made by such as surface states of the inner surface of the frame and the lateral surface of the light emitting element, an angle, and an injection amount. Furthermore, this inclined surface may be a planar surface in a cross-sectional view, or may be a curved surface such as a convex curved surface or a concave curved surface.

Hereinafter, the components in each embodiment will be described in detail.

Support Body

The support body has the upper surface on which the frame is mounted, and may be for example a flat-plate support body. The recessed portion in which the light emitting element is mounted is composed of the upper surface of the support body and the frame, and the upper surface of the support body serves as a bottom surface of the recessed portion. The support body is a base to support each member in respective steps. For example, the support body integrally supports the members in the step of mounting the light emitting element, the step of mounting the frame, the step of forming the covering member, and the step of forming the light-transmissive member. Therefore, the support body is preferably a member having a certain level of strength.

Furthermore, the support body is separated from the frame before the light emitting device is singulated. The support body can be separated from the frame by removing a bonding agent, or cutting. Thus, the support body itself is not included in the light emitting device. The support body and the frame are bonded with the bonding member, and they are preferably bonded by force to the extent that they are not separated in each step. However, since the support body is separated from the frame in the final stage, the bonding member which can be easily separated from the frame is preferably used.

The support body may be an electrically conductive support body or an insulating support body. For example, the support body includes a metal plate made of Cu, stainless, resin, or glass. Furthermore, the bonding member to bond the support body to the frame includes a silicone resin.

Frame

The frame includes the opening having an area larger than the upper surface of the light emitting element. The frame preferably has the plurality of openings. Furthermore, the openings preferably include the element mounting opening in which the light emitting element is mounted, and the resin supplying opening. The plurality of light emitting element mounting openings can be provided in the one frame. The adjacent openings can share one frame (i.e., side wall). The resin supplying opening is provided adjacently to the light emitting element mounting opening, and the through hole is provided in the frame (i.e., side wall) between the two openings.

The frame is cut around the opening in which the light emitting element is mounted. At this time, when the frame is cut so that the frame is left around each of the light emitting devices, the outside of the covering member around the light emitting element can be covered with the frame. That is, the frame serves as the outer surface of the singulated light emitting device. In the case where the frame includes the plurality of openings, and the frame provided between the two right and left openings is cut along its center for example, the frame can serve as outer surfaces of the right light emitting device and the left light emitting device.

The upper surface of the frame serves as a part of the upper surface of the light emitting device. The upper surface of the frame may be a planar surface or a curved surface. Furthermore, the upper surface of the frame may be a coarse surface. The lower surface of the frame serves as a part of the lower surface of the light emitting device. The lower surface of the frame is preferably a planar surface because it is mounted on the upper surface of the support body.

The through hole or the notch (i.e., recessed portion in the lower surface) in the frame serves as the inlet used for injecting the resin into the opening. One or more through holes may be provided for the one opening of the frame. In addition, the through hole or the notch can be shared by the two openings. The upper end of the through hole or the notch is to be provided in a position lower than the light emitting layer of the light emitting element mounted in the opening, in a vertical direction of the frame.

An open shape of the through hole or the notch may be a polygonal shape such as quadrangle or triangle, circular shape, elliptical shape, or combined shape of those. Furthermore, an open shape on the inner surface side and an open shape on the outer surface side may be the same or different from each other. Furthermore, their sizes thereof may be the same or different from each other. For example, an open diameter on the outer surface side may be larger or smaller than an open diameter on the inner surface side.

In addition, an inner wall of the through hole extending from the inner surface to the outer surface may have a planar surface or a curved surface. Furthermore, the inner wall may have an uneven surface or step difference. Furthermore, the through hole may branch in the frame (in the side wall) in such a manner that one opening is provided on the outer surface and two openings are provided on the inner surface.

The frame can be formed by injection molding, compression molding, transfer molding, printing, or spraying.

For example, the frame is preferably made of thermosetting resin such as silicone resin, silicone modified resin, epoxy resin, or phenol resin. The material may be the same as that of the covering member to be described later or different from it.

The frame can be made of light-transmissive resin, or light-reflective resin. The light-reflective resin may be a resin having a reflectivity of 70% or more with respect to the light from the light emitting element. Alternatively, the frame may be made of light-absorptive resin.

The light-reflective resin may be provided by for example diffusing a light-reflective material in the light-transmissive resin. For example, the light-reflective material is preferably titanium oxide, silicon oxide, zirconium oxide, potassium titanate, aluminum oxide, aluminum nitride, boron nitride, and mullite. The light-reflective material may be in the form of particle, fiber, or flake, but the fiber is especially preferable because an effect to lower a thermal expansion rate of the covering member can be expected.

Light Emitting Element

The light emitting element may be a semiconductor light emitting element such as light emitting diode, and the light emitting element may emit a visible light such as blue, green, or red light. The semiconductor light emitting element includes the layered structure including the light emitting layer, and the electrode. The layered structure has the surface on which the electrode is formed (electrode forming surface), and the light extracting surface on an opposite side.

The layered structure includes semiconductor layers including the light emitting layer. Furthermore, it may include a light-transmissive substrate made of sapphire, or the like. For example, the stacked semiconductor layers may include three semiconductor layers such as a first conductivity type semiconductor layer (such as n-type semiconductor layer), a light emitting layer (active layer), and a second conductivity type semiconductor layer (such as p-type semiconductor layer). The semiconductor layer which can emit an ultraviolet light or a visible light such as blue to green light may be made of semiconductor material such as group III-V compound semiconductor, or group II-VI compound semiconductor. More specifically, the semiconductor material may be a nitride-based semiconductor material such as $In_XAl_YGa_{1-X-Y}N$ ($0 \leq X$, $0 \leq Y$, $X+Y \leq 1$) (for example InN, AlN, GaN, InGaN, AlGaN, or InGaAlN). The stacked semiconductor layer which can emit the red light may be made of GaAs, GaAlAs, GaP, InGaAs, or InGaAsP.

The light emitting element includes a pair of electrodes, and the electrodes are disposed on the same surface (i.e., electrode forming surface) of the layered structure. The pair of electrodes may have a single-layer structure or a stacked-layer structure as long as it can be ohmic-connected to the layered structure so that linear or almost linear currentvoltage characteristics can be provided. This electrode may be formed of common material so as to have a common configuration and a certain thickness in this related field. For example, the thickness of the electrode is preferably several tens of μm to 300 μm. Furthermore, the electrode may be made of electrically conductive material and preferably made of metal such as Cu.

Covering Member

The covering member is preferably a thermosetting resin such as silicone resin, silicon modified resin, epoxy resin, or phenol resin.

The covering member may be formed of light-reflective resin. The light-reflective resin means a resin material having a reflectivity of 70% or more with respect to the light from the light emitting element. For example, a white resin is preferably used. Thus, the light is reflected by the covering member and sent toward the light emitting surface of the light emitting device, so that light extracting efficiency of the light emitting device can be enhanced.

The light-reflective resin may be provided by, for example, diffusing a light-reflective material in a light-transmissive resin. For example, the light-reflective material is preferably titanium oxide, silicon oxide, zirconium oxide, potassium titanate, aluminum oxide, aluminum nitride, boron nitride, and mullite. The light-reflective material may be in the form of particle, fiber, or flake, but the fiber is especially preferable because an effect to lower a thermal expansion rate of the covering member can be expected.

Light-Transmissive Member

The light-transmissive member is made of light-transmissive material such as light-transmissive resin or glass. Especially, the light-transmissive resin is preferably used, and the material may be a thermosetting resin such as silicone resin, silicon modified resin, epoxy resin, or phenol resin, or may be a thermoplastic resin such as polycarbonate resin, acrylic resin, methylpentene resin, or polynorbornene resin. Especially, the silicone resin is preferably used because it has good light resistance and heat resistance properties.

The light-transmissive member may contain a fluorescent material in addition to the above light-transmissive material. The fluorescent material is to be excited by the light emitted from the light emitting element. The fluorescent material which can be excited by light emitted from a blue-light emitting element or an ultraviolet-light emitting element includes, for example, cerium-activated yttrium aluminum garnet (Ce: YAG)-based fluorescent material; cerium-activated lutetium aluminum garnet (Ce: LAG)-based fluorescent material; europium and/or chrome-activated nitrogen-containing calcium aluminosilicate ($CaO-Al_2O_3-SiO_2$)-based fluorescent material; europium-activated silicate (($Sr, Ba)_2SiO_4$)-based fluorescent material; nitride-based fluorescent material such as β sialon fluorescent material, CASN-based fluorescent material, or SCASN-based fluorescent material; KSF ($K_2SiF_6$: Mn)-based fluorescent material; sulfide-based fluorescent material, and quantum dot fluorescent material. With the blue-light emitting element or ultraviolet-light emitting element combined with the above fluorescent material, the light emitting device that can emit lights having various colors, such as white light based light emitting device can be manufactured.

Furthermore, the light-transmissive member may contain various kinds of fillers for the purpose of adjustment of viscosity, or the like.

In the case where the light-transmissive member includes the first light-transmissive member not containing the fluorescent material and the second light-transmissive member containing the fluorescent material, the above light-transmissive material may be used as the light-transmissive material. The light-transmissive material for the first light-transmissive member and the light-transmissive material for the second light-transmissive member may be the same or different from each other. Furthermore, the fluorescent material contained in the second light-transmissive member may be selected from the above fluorescent materials.

Several embodiments of the present invention have been described, but the present invention is not limited to the above embodiments and may be appropriately modified without departing from the scope of the present invention as a matter of course.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a light emitting device, comprising:
   providing a frame having a frame upper surface and a frame lower surface opposite to the frame upper surface in a height direction, the frame having an opening extending from the frame upper surface to the frame lower surface in the height direction, the frame having a frame inner lateral surface defining the opening and a frame outer lateral surface connecting the frame upper surface and the frame lower surface to surround the opening when viewed in the height direction, the frame having a communication path extending from the frame outer lateral surface to the frame inner lateral surface such that a lower end of the communication path is separated from the frame lower surface in the height direction;
   providing a support body on the frame lower surface, the support body having a support body upper surface that faces the frame lower surface;
   providing a light emitting element on the support body upper surface in the opening of the frame, the light emitting element having an element lower surface facing the support body upper surface and an element upper surface opposite to the element lower surface in the height direction, a light being configured to be emitted from the element upper surface;
   injecting resin into the opening of the frame via the communication path to provide a covering member in the opening such that at least a part of the element upper surface of the light emitting element is exposed from the covering member;
   providing a light-transmissive member on the element upper surface and the covering member; and
   removing the support body.

2. The method according to claim 1,
   wherein the covering member is provided in the opening such that the covering member contacts the support body at a covering member lower surface of the covering member, and
   wherein the covering member lower surface in the opening is exposed when the support body is removed.

3. The method according to claim 1,
   wherein the frame has a resin supplying opening extending from the frame upper surface to the frame lower surface in the height direction and communicating with the opening via the communication path, the resin being injected into the communication path via the resin supplying opening, and wherein the light emitting element is not provided in the resin supplying opening on the support body upper surface.

4. The method according to claim 3, further comprising: cutting the frame between the resin supplying opening and the opening as viewed in the height direction.

5. The method according to claim 1, wherein the frame has an additional opening extending from the frame upper surface to the frame lower surface in the height direction, the method further comprising:
   providing an additional light emitting element on the support body upper surface in the additional opening of the frame;
   providing an additional covering member in the additional opening;
   providing a light-transmissive member provided on the additional light emitting element and the additional covering member; and
   cutting the frame between the additional opening and the opening as viewed in the height direction.

6. The method according to claim 1, wherein the light-transmissive member comprises a fluorescent material.

7. The method according to claim 1, wherein the communication path includes a through hole extending from the frame outer lateral surface to the frame inner lateral surface.

8. A light emitting device comprising:
   a light emitting element comprising:
      a layered structure including a light emitting layer; and
      an electrode provided on the layered structure in a height direction and having an inner surface contacting the layered structure, an outer surface opposite to the inner surface in the height direction, and a lateral surface connecting the inner surface and the outer surface;
   a first covering member covering the lateral surface of the electrode; and
   a second covering member covering the first covering member, the second covering member having a first wall and a second wall opposite to the first wall in a first lateral direction perpendicular to the height direction and having a third wall and a fourth wall opposite to the third wall in a second lateral direction perpendicular to the height direction and to the first lateral direction, a first part of the first covering member being exposed from the second covering member as viewed in the height direction, a second part of the first covering member being exposed from the first wall as viewed in the first lateral direction, the first covering member being not exposed from the second wall in the first lateral direction, the first covering member being not exposed from the third wall and the fourth wall in the second lateral direction.

9. The light emitting device according to claim 8, wherein a thickness of the first covering member is substantially equal to a thickness of the electrode.

10. The light emitting device according to claim 8, wherein
    the first covering member comprises light-reflective resin.

11. The light emitting device according to claim 8, wherein
    the second covering member comprises light-reflective resin.

12. The light emitting device according to claim 8, wherein
    a surface of the electrode, a surface of the first covering member, and a surface of the second covering member lie on a substantially same flat plane.

13. The light emitting device according to claim 8, further comprising:
    a light-transmissive member provided on an upper surface of the light emitting element.

14. The light emitting device according to claim 13, wherein
    the light-transmissive member comprises a fluorescent material.

15. The light emitting device according to claim 13, wherein
    the light-transmissive member covers a lateral surface of the light emitting element.

16. The method according to claim 5,
    wherein the frame has an additional frame inner lateral surface defining the additional opening and an additional frame outer lateral surface connecting the frame upper surface and the frame lower surface to surround the additional opening when viewed in the height direction, the frame having an additional communication path extending from the additional frame outer lateral surface to the additional frame inner lateral surface, and
    wherein the resin supplying opening communicates with the additional opening via the additional communication path, the resin being injected into the additional communication path via the resin supplying opening.

* * * * *